(12) United States Patent
Mallik et al.

(10) Patent No.: US 10,890,444 B2
(45) Date of Patent: Jan. 12, 2021

(54) SYSTEM AND METHOD FOR ESTIMATING THREE-DIMENSIONAL MEASUREMENTS OF PHYSICAL OBJECTS

(71) Applicant: Tata Consultancy Services Limited, Mumbai (IN)

(72) Inventors: Apurbaa Mallik, Kolkata (IN); Brojeshwar Bhowmick, Kolkata (IN); Aniruddha Sinha, Kolkata (IN); Aishwarya Visvanathan, Bangalore (IN); Sudeb Das, Kolkata (IN)

(73) Assignee: Tata Consultancy Services Limited, Mumbai (IN)

( * ) Notice: Subject to any disclaimer, the term of this patent is extended or adjusted under 35 U.S.C. 154(b) by 880 days.

(21) Appl. No.: 15/154,476

(22) Filed: May 13, 2016

(65) Prior Publication Data

US 2016/0334210 A1    Nov. 17, 2016

(30) Foreign Application Priority Data

May 15, 2015    (IN) .......................... 1914/MUM/2015

(51) Int. Cl.
*G01B 21/06*    (2006.01)
*G01C 19/00*    (2013.01)
(Continued)

(52) U.S. Cl.
CPC .............. *G01B 21/06* (2013.01); *G01C 5/00* (2013.01); *G01C 11/06* (2013.01); *G01C 19/00* (2013.01);
(Continued)

(58) Field of Classification Search
CPC combination set(s) only.
See application file for complete search history.

(56) References Cited

U.S. PATENT DOCUMENTS 6,542,249 B1    4/2003    Kofman et al.
8,768,647 B1 *  7/2014    Zaki ...................... G01C 21/16
                                                702/150
(Continued)

FOREIGN PATENT DOCUMENTS

WO    WO-2014/100950    7/2014

OTHER PUBLICATIONS

Statistical Sensor Fusion-Lab 2 "Orientation Estimation using Smartphone Sensors" pp. 1-19; May 2014.*

*Primary Examiner* — Regis J Betsch
*Assistant Examiner* — Kaleria Knox
(74) *Attorney, Agent, or Firm* — Finnegan, Henderson, Farabow, Garrett & Dunner LLP

(57) ABSTRACT

Method and System for estimating three dimensional measurements of a physical object by utilizing readings from inertial sensors is provided. The method involves capturing by a handheld unit, three dimensional aspects of the physical object. The raw recordings are received from the inertial sensors and are used to develop a raw rotation matrix. The raw rotation matrix is subjected to low pass filtering to obtain processed matrix constituted of filtered Euler angles wherein coordinates from the processed rotation matrix is used to estimate gravitational component along the three axis leading to determination of acceleration values and further calculation of measurement of each dimension of the physical object.

10 Claims, 2 Drawing Sheets

(51) Int. Cl.
  G01P 15/18  (2013.01)
  G01R 33/02  (2006.01)
  G01V 7/06  (2006.01)
  G01C 5/00  (2006.01)
  G01C 11/06  (2006.01)

(52) U.S. Cl.
  CPC .......... G01P 15/18 (2013.01); G01R 33/0206 (2013.01); G01V 7/06 (2013.01)

(56) References Cited

U.S. PATENT DOCUMENTS

| | | | |
|---|---|---|---|
| 8,970,625 B2 | 3/2015 | Chavez et al. | |
| 9,605,966 B2* | 3/2017 | Villien | G01C 21/12 |
| 2007/0178967 A1* | 8/2007 | Rosenberg | A63B 24/0087 |
| | | | 463/39 |
| 2011/0254760 A1* | 10/2011 | Lloyd | G01P 15/00 |
| | | | 345/156 |
| 2014/0063258 A1* | 3/2014 | Schweid | G01S 11/12 |
| | | | 348/154 |
| 2014/0100813 A1* | 4/2014 | Showering | G01B 21/02 |
| | | | 702/141 |
| 2014/0104156 A1* | 4/2014 | Touma | G06F 3/014 |
| | | | 345/156 |
| 2014/0201666 A1* | 7/2014 | Bedikian | G06F 3/017 |
| | | | 715/771 |
| 2014/0274141 A1* | 9/2014 | Gholmieh | H04W 4/02 |
| | | | 455/456.3 |
| 2015/0338875 A1* | 11/2015 | Aujay | A63F 13/06 |
| | | | 700/85 |
| 2016/0098095 A1* | 4/2016 | Gonzalez-Banos | G06F 3/017 |
| | | | 345/156 |

* cited by examiner

SYSTEM AND METHOD FOR ESTIMATING THREE-DIMENSIONAL MEASUREMENTS OF PHYSICAL OBJECTS

PRIORITY CLAIM

The present application claims priority from Indian Provisional Patent Application No. 1914/MUM/2015, filed on May 15, 2015, the entirety of which is hereby incorporated by reference.

TECHNICAL FIELD

The invention generally relates to estimating three-dimensional (3D) measurements and more particularly, relates to a system and method of estimating three-dimensional measurements of physical objects.

BACKGROUND

Conventionally, methods and systems are known for estimating the dimensional aspects of a physical object without actually coming in physical contact with an object. One of such method involves usage of markers for which the true dimension is already known. The method involves capturing the image of an object wherein the digital image constitutes an array of pixels. Each pixel therefore has a pixel size of measurable physical dimensions which can be determined. These physical dimensions can be related to known positions of pixels determined within a marker. The correlation of physical dimension by using markers suffers from the disadvantages of limited precision, application restricted to handling planer objects. Furthermore, such methods also require user interaction to manually identify the boundary of object under consideration.

Another method for estimating three-dimensional measurements involves utilizing sensors offering better precision in terms of percentage of accuracy and time taken to provide such dimensional aspects. However, such methods require additional infrastructure limiting the access of such technology for common users due to cost and space constraints.

With the popularity of hand held devices due to their ubiquity, ease of working on multiple applications and in-build inertial sensors to measure various environmental factors makes them suitable devices for carrying out various functions as desired by users. However when it comes to estimating three dimensional measurements of a physical object, the prior art simply does not offer any application with real-time three dimensional measurement technology utilizing the inertial sensors installed within hand-held device.

SUMMARY

Methods and Systems are described that enable estimation of three-dimensional measurements of physical objects. Augmenting the accuracy of estimation of three dimensional measurements and reducing the cost of such estimation due to usage of hand held devices are some of the outcomes provided by the systems and methods of present disclosure with applicability to other domains without posing any difficulty.

In an aspect, there is provided a system for estimating three-dimensional measurements of a physical object comprising: a handheld unit for capturing three dimensional aspects of the physical object; one or more processor; a memory coupled to the one or more processor wherein the processor is capable of executing programmed instructions stored in the memory to: receive the raw data recordings using a gyroscope, a magnetometer, and an accelerometer to develop a raw rotation matrix perform low pass filtering of the rotation matrix to obtain processed Matrix constituted of filtered Euler angles; estimate gravitational component along X-axis, Y-axis and Z-axis by taking coordinates from the processed rotation matrix into consideration; determine acceleration values by subtracting gravitational components from every raw data recordings obtained from the accelerometer; calculate a distance covered by the accelerometer for each dimension; estimate the measurement of each dimension of the physical object by summation of the distance calculated for each dimension by the accelerometer.

In accordance with an embodiment, the dimensions of the physical object are length, width and height.

In accordance with another embodiment, the shape of the physical object is both regular and irregular.

In accordance with another embodiment, for capturing three dimensional aspects of the physical object, one of the handheld unit and the physical object is moved while the other is kept stationary.

In accordance with yet another embodiment, the rotation matrix is a 3×3 matrix wherein each element represents one coordinate describing rotated position of one of unit vectors relative to reference set of coordinates.

In accordance with an embodiment, the distance covered by the accelerometer is estimated using Newton's law of motion.

In accordance with an embodiment, the shape of the physical object is both regular and irregular.

In another aspect, there is provided a method for estimating three-dimensional measurements of a physical object, the method comprising: capturing, by a handheld unit, three dimensional aspects of the physical object; receiving, by a processor, the raw data recordings using a gyroscope, a magnetometer, and an accelerometer to develop a raw rotation matrix; performing, by the processor, low pass filtering of the rotation matrix to obtain processed Matrix constituted of filtered Euler angles; estimating, by the processor gravitational projection on X-axis, Y-axis and Z-axis by taking coordinates from the processed rotation matrix into consideration; determining, by the processor, acceleration values by subtracting gravitational components from every raw data recordings obtained from the accelerometer; calculating, by the processor, a distance covered by the accelerometer for each dimension; estimating, by the processor, the measurement of each dimension of the physical object by summation of the distance calculated for each dimension by the accelerometer.

In accordance with an embodiment, the dimensions of the physical object are length, width and height.

In accordance with another embodiment, the shape of the physical object is both regular and irregular.

In accordance with yet another embodiment, for capturing three dimensional aspects of the physical object, one of the handheld unit and the physical object is moved while the other is kept stationary.

In accordance with another embodiment, the rotation matrix is a 3×3 matrix wherein each element represents one coordinate describing rotated position of one of unit vectors relative to reference set of coordinates.

In accordance with another embodiment the distance covered by the accelerometer is estimated using Newton's law of motion.

In accordance with another embodiment, the gravitational components X-axis, Y-axis and Z-axis are calculated by taking coordinates from the processed rotation matrix into consideration.

BRIEF DESCRIPTION OF THE DRAWINGS

The embodiments herein will be better understood from the following detailed description with reference to the drawings, in which.

Figure 1:
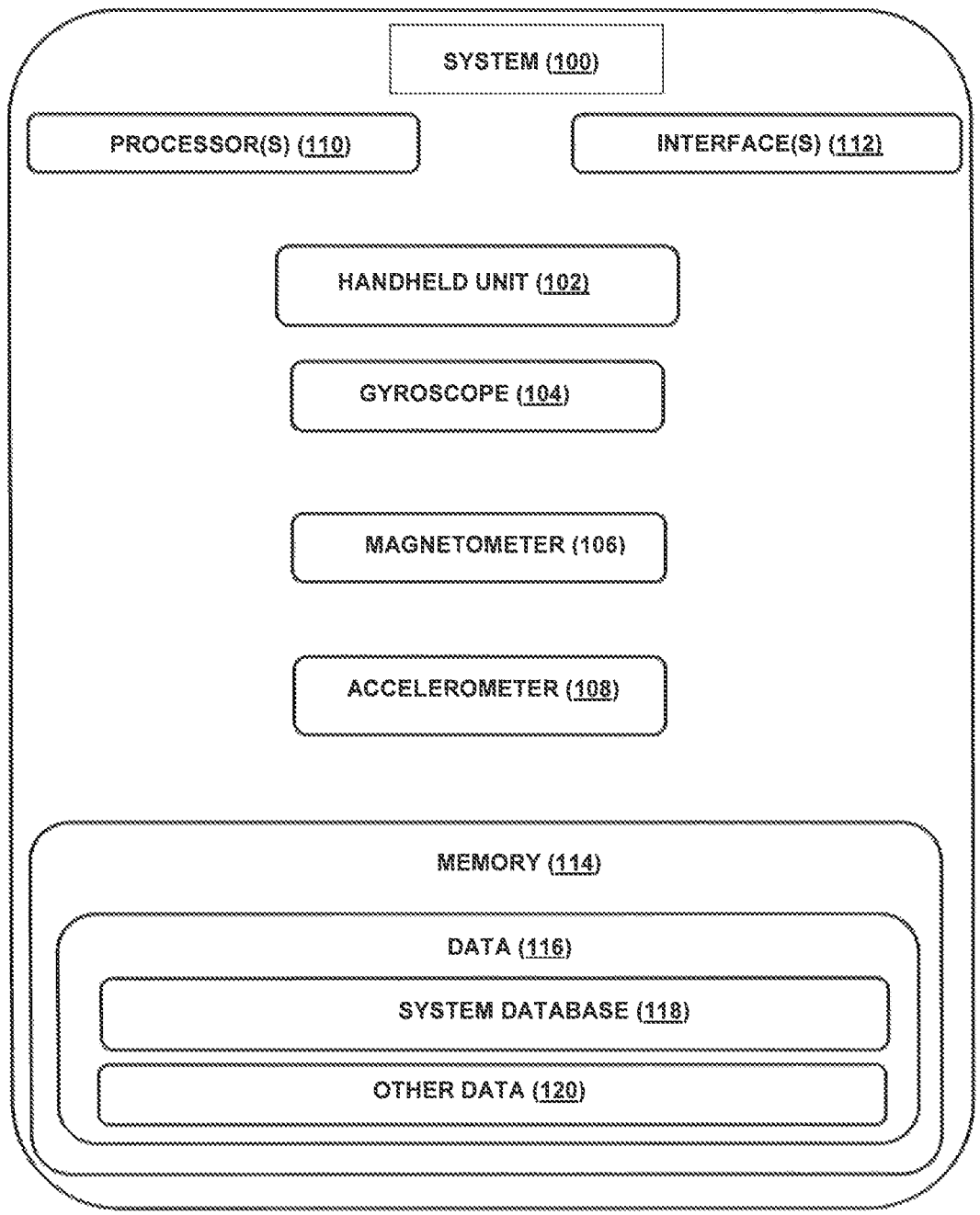
FIG. 1 illustrates a schematic view of a system for estimating the three dimensional aspects of a physical object according to an embodiment of the present invention.

It should be appreciated by those skilled in the art that any block diagram herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and so executed by a computing device or processor, whether or not such computing device or processor is explicitly shown.

DETAILED DESCRIPTION

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims. Systems and methods for estimating three dimensional measurements are described. The present subject matter discloses a mechanism for estimating the three dimensional aspects of a physical object. The system 100 comprises of handheld unit 102 for capturing the three dimensional aspects of the physical object. Further, the system 100 may also comprise a gyroscope 104, a magnetometer 106, and an accelerometer 108 for determining angular velocity, gravitational component along an axis of the handheld unit 102 of the system 100 and acceleration respectively.

In one embodiment, a method comprises estimating three dimensional measurements including length, width and height, of a physical object by using at least one signal received from at least one inertial sensor incorporated within a mobile computing device. The method comprises of recording sensor data through a combination of sensors and thereby generating a raw rotation matrix whereby the data is subsequently filtered through at least one filter to generate the final Rotation matrix "Rot" and after further calculations as initiated within mobile computing device, the three dimensional measurements are estimated. The below section describes the details of the method, in accordance to the invention.

While aspects of described system and method for estimating the three dimensional measurements may be implemented in any number of different computing systems, environments, and/or configurations, the embodiments are described in the context of the following exemplary system.

Referring now to FIG. 1, the system 100 for estimating the three dimensional measurements using the physical aspects of a physical object is shown, in accordance with an embodiment of the present subject matter. Although the present subject matter is explained considering that the system 100 is implemented on a mobile device it may be understood that the system 100 may also be implemented in a variety of computing systems including but not limited to, a smart phone, a tablet, a notepad, a personal digital assistant, a handheld device, a laptop computer, a desktop computer, a notebook, a workstation, a mainframe computer, a server, a network server, wherein each of the devices comprise an image capturing unit/camera.

The system 100 may include at least one processor 110, an input/output (I/O) interface 112, a handheld unit 102, a gyroscope 104, a magnetometer 106, an accelerometer 108, and a memory 114. The gyroscope 104, the magnetometer 106, and the accelerometer 108 may have similar sampling rates. Further, the at least one processor 110 may be implemented as one or more microprocessors, microcomputers, microcontrollers, digital signal processors, central processing units, state machines, logic circuitries, and/or any devices that manipulate signals based on operational instructions. Among other capabilities, the at least one processor 110 is configured to fetch and execute computer-readable instructions stored in the memory 114.

The I/O interface 112 may include a variety of software and hardware interfaces, for example, a web interface, a graphical user interface, and the like. The I/O interface 112 may allow the system 100 to interact with a user directly. Further, the I/O interface 112 may enable the system 100 to communicate with other computing devices, such as web servers and external data servers (not shown). The I/O interface 112 can facilitate multiple communications within a wide variety of networks and protocol types, including wired networks, for example, LAN, cable, etc., and wireless networks, such as WLAN, cellular, or satellite. The I/O interface 112 may include one or more ports for connecting a number of devices to one another or to a server.

The memory 114 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 114 may include data 116.

The data 116, amongst other things, serves as a repository for storing data processed, received, and generated by the at least one processor 110. The data 116 may also include a system database 118, and other data 120.

The handheld unit 102 may refer to any type of mobile or standalone device, including any combination of hardware and software, capable of supporting the functionalities and data processing techniques as discussed herein. For example the handheld unit 102 can include a handheld mobile phone (e.g., iPhone™ or Android™ smart phones), a handheld mobile device (e.g., iPod Touch™), a tablet (e.g., iPad™), a PDA, a notebook computer, a personal data assistant (PDA) or the like. The handheld unit 102 may be configured to be hand-held or otherwise free to move or to be moved in one or more linear and/or rotational directions.

In one implementation, at first, a user may capture the three dimensional aspects of the physical object using the handheld unit 102. The three dimensional aspects may be captured from different viewpoints/locations/angles in order to collect the maximum details of the physical object. Further, both the system 100 and the object may be stationary while the handheld unit 102 is capturing aspects of the object. The system 100, when stationary, allows the handheld unit 102 to capture aspects of the physical object with a proper accuracy. While capturing the three dimensional aspects, the system 100 may employ the gyroscope 104, the magnetometer 106 and the accelerometer 108 for capturing the three dimensional aspects.

The magnetometer 106 may be configured to determine directional headings, for example, based on traditional cardinal directions. The magnetometer 106 may be configured to measure the magnetic intensity experienced by the handheld unit 102. Under influence of Earth's magnetic field, the magnetometer 106 may indicate the absolute geographic direction, in particular, a direction to the geographic north by knowing the magnetic declination, which varies with geographical location.

The gyroscope 104 may be or include one or more on-chip gyrating circuits implemented with Micro Electro-Mechanical Systems (MEMS) technology to form a piezoelectric gyroscope, a vibrating wheel gyroscope, a tuning fork gyroscope, a hemispherical resonator gyroscope, or a rotating wheel gyroscope that responds to inertial forces, such as Coriolis acceleration or linear acceleration. The gyroscope 104 may be configured to measure the angular velocity of the mobile computing device 100 housing the gyroscope 104. That is, gyroscope 104 provides angular velocity as sensor recordings.

The Accelerometer 108 can sense or measure the linear acceleration of the handheld unit 102 (or portion thereof) housing the accelerometer 108. The accelerometer 108 operates by measuring the deflection of a small mass suspended by springs. The natural frequencies of the dynamics of the accelerometer 108 are generally high and thus it responds quickly. The accelerometer 108 outputs the sum of the linear acceleration in device coordinates and tilt due to gravity. In the present embodiment, the accelerometer 108 may be a single, two, three, or more axis inertial, MEMS, and/or solid state accelerometer or the like. In the preferred embodiment, the accelerometer 108 may be a three axis inertial accelerometer.

These three sensors viz, the gyroscope 104, the magnetometer 106 and the accelerometer 108, are configured to detect rotational motion about a separate axis. Furthermore, the sensors may be configured to provide raw sensor recordings.

The processor 110 is configured to receive and translate the raw recordings from gyroscope 104, the magnetometer 106 and the accelerometer 108. The processor configured to 110 operate by converting the data recordings received as an output from the gyroscope 104, the magnetometer 106 and the accelerometer 108 into raw Rotation Matrix. The processor 110 employs low pass filtering and window based median filtering and other filters and algorithms to convert the raw Rotation Matrix into processed measurements of a three dimensional physical object.

Accordingly, the processor 110 is configured to collect the raw recordings from the three sensors and processes these raw readings into processed measurements. The processor 110 may feed these processed measurements into the memory 114 and such processed measurements can be pulled upon for user's review using the interface 112.

Figure 2:
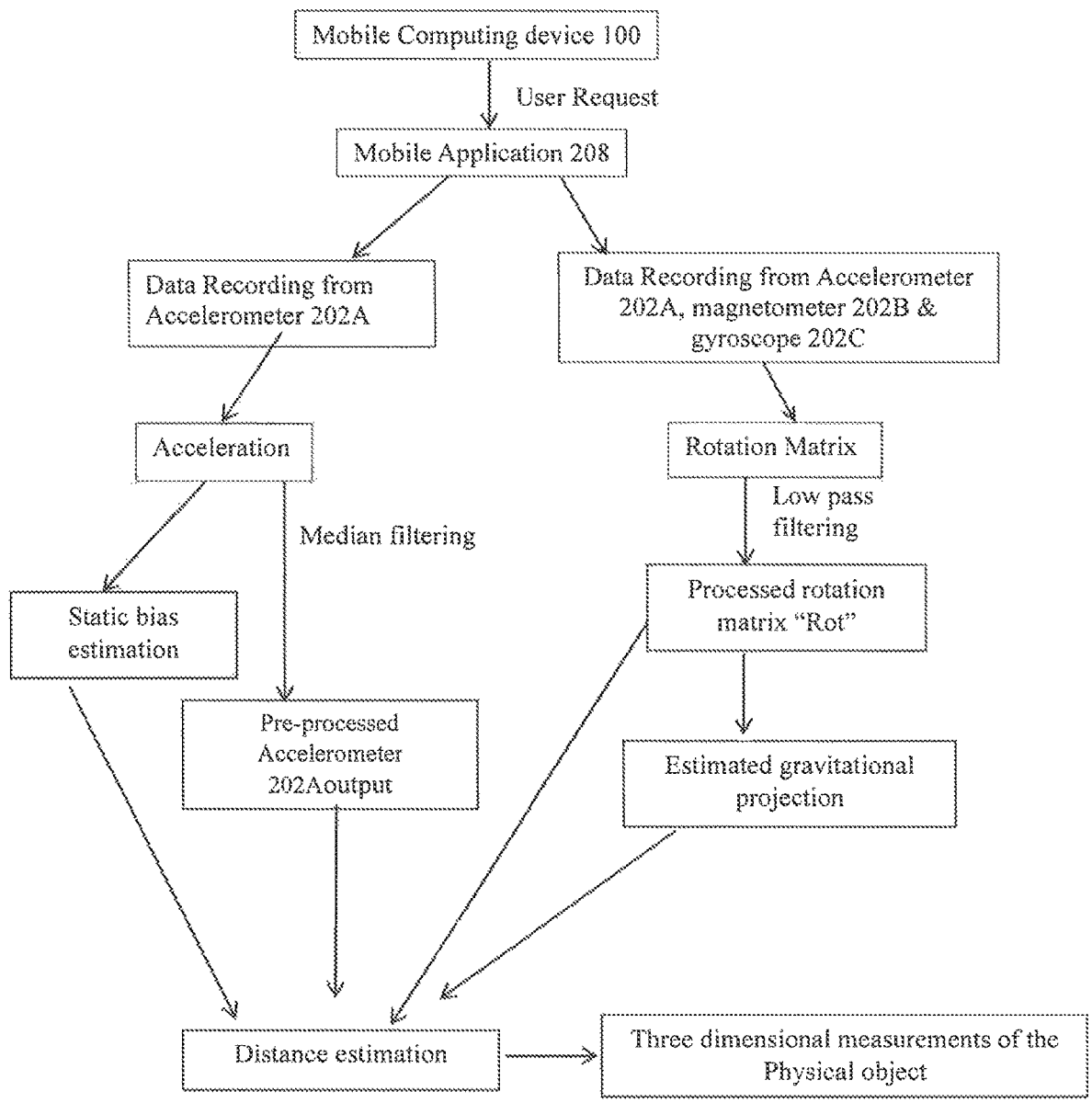
FIG. 2 illustrates a method for estimating the three dimensional aspects of a physical object according to an embodiment of the present invention.

FIG. 2 illustrates a method for estimating the three dimensional aspects of a physical object according to an embodiment of the present invention. In this embodiment, the three dimensional measurements of a physical objects are estimated through data recordings obtained from three sensors i.e. gyroscope 104, the magnetometer 106 and the accelerometer 108. It is further reiterated that the three dimensional measurements include the length, width and height (depth as per the case).

The method begins at the step when the user holds the handheld unit 102 in an upright position preferably. Further, the user moves the handheld unit 102 along the three identifiable dimensions of the physical object. Accordingly, the user moves the handheld device 102 along the length, width and height (three dimensions) of the physical object. Accordingly, the gyroscope 104, the magnetometer 106 and the accelerometer 108 records the data as the handheld unit 102 is moved around the physical object.

The processor 110 receives raw data recordings from gyroscope 104, the magnetometer 106 and the accelerometer 108 wherein the combination of data recordings is used to develop a raw rotation matrix (Not shown) to express the orientation of the physical object in Earth coordinates. The rotation matrix obtained at this stage is raw in nature. The rotation matrix is a 3×3 matrix where each element of raw rotation matrix may represent one coordinate that describes the rotated position of one of the unit vectors in terms of a non-rotated, reference set of coordinates. The columns in rotation matrix represent unit vectors in the body axes, projected along the reference axis.

It is to be noted that initial data recordings from the three sensors are obtained in device coordinates. As to obtain the orientation of device in Earth's frame of reference, the data recordings from the sensors, is transformed into Earth coordinate system. The transformation from the device coordinates to the Earth coordinates requires the rotation about three axes. Within Earth coordinate system wherein the Z-axis is the unit vector towards the direction of gravity, Y-axis is the vector towards the true magnetic north direction indicated by the magnetometer 106 and X-axis is calculated using cross product of Z-axis and Y-axis.

In the present embodiment, the device coordinates may be transformed to Earth's coordinates to obtain the device orientation in Earth coordinate system through Euler Angle Method. In the Euler Angle Method, the orientation of a physical object may be represented using Euler angles. "Euler angles" are the three angular parameters including azimuth angle (rotation of XY plane), roll angle (rotation of XZ plane) and pitch angle (rotation of YZ plane), that may be used to specify the orientation of a physical object with respect to reference axes. The Euler angles are obtained through the raw rotation matrix.

The data recorded within the raw rotation matrix has drifts and noises recorded due to presence of disturbances such as magnetic vibrations and other factors causing the data recordings to be deviate from true values. Furthermore, due to such unwelcomed vibrations, the data recordings exhibit short interval variations. To remove the noises and drifts in the data recordings, the Euler angles are subjected to low pass filter to obtain the processed rotation Matrix "Rot" which is constituted of the filtered Euler angles.

$$Rot = \begin{bmatrix} r1 & r2 & r3 \\ r4 & r5 & r6 \\ r7 & r8 & r9 \end{bmatrix}$$

Apart from taking combined readings of the three sensors —, the individual data recordings from accelerometer 108 is further collected. The accelerometer 108 in static condition should read as zero, however, due to presence of static bias (Static bias is due to various factors including residual magnetism, mechanical force effects such as static torque on apparatus components, and spring forces) extraneous signals in the load circuit of accelerometer 108 provides the non-zero acceleration values. To overcome static bias, a correction factor is applied to receive non-erroneous values from the accelerometer 108.

The static bias is estimated as mention as equation (1)

$$b_{mean} = \frac{1}{N}\sum(a_i),\qquad(1)$$

where, i=1 . . . N and there are "N" is number the sensor readings when the phone is in static condition.

The accelerometer 108 readings further gets affected due to environmental factors such as random jerks affecting the sensor output while recording the readings and sensor noises. Such disturbances cause the accelerometer 108 to generate spurious data recordings in a random time interval. Such noise in accelerometer 108 data recordings has an effect on dimension estimation. To reduce such effect, sensor output from accelerator is filtered through a non-linear signal filter i.e. median filter signal with a window length W to pre-process the accelerometer 108 output.

For a window of length W, the accelerometer 108 output as depicted in equation (2) will be:

$$a_{[w/2]}=\text{Median}(a_j)\qquad(2)$$

Where, j=1 . . . W wherein W is an odd number and w<M, M=number of sensor readings when the user is scanning the object with the handheld unit 102 for estimating the dimensions.

As stated earlier, the accelerometer 108 is a three-axis accelerometer which is adapted to provide measurement of acceleration in three orthogonal axis viz. longitudinal axis X, lateral axis Y and height axis Z. The accelerometer 108 measures the acceleration values for every axis taking gravitational component (g) into consideration. The gravitational component (g) is reflected in accelerometer reading along the three axis. In order to precisely determine the three dimensional measurements of a physical object, the gravitational component (g) must be removed.

For each axis, the gravitational component (g) is represented by Equation (3) wherein $g^x$ is gravitational component along X-axis, $g^y$ is gravitational component along Y-axis and $g^z$ is the gravitational component along Z-axis.

$$g=[g^x g^y g^z]\qquad(3)$$

The values of gravitational components $g^x g^y$ and $g^z$ may be estimated as per the equation (4) wherein the coordinates from processed rotation matrix "Rot" are taken into consideration:

$$g^x = g * \frac{r7}{\sqrt{(r1)^2 + (r4)^2 + (r7)^2}}\qquad(4)$$

$$g^y = g * \frac{r8}{\sqrt{(r2)^2 + (r5)^2 + (r8)^2}}$$

$$g^z = g * \frac{r9}{\sqrt{(r3)^2 + (r6)^2 + (r9)^2}}$$

wherein the g is the acceleration due to gravity for earth and is taken as 9.81 m/sec².

The acceleration values are obtained after subtracting gravitational component for every accelerometer readings as per equation (5):

$$a_i^g = a - g\qquad(5)$$

Subsequent to estimating the acceleration values, the distance $s_i$ covered by the accelerometer 108 for each dimension d (length, width and height) is estimated through equation (6) and (7). The distance $s_i$ is calculated for every $i^{th}$ Accelerometer reading using Newton's law of motion.

$$s_i = u_i \Delta t_i + 0.5 * \text{Rot}_i * (a_i^g - b_{mean}) \Delta t_i^2\qquad(6)$$

where, $s_i$ is the distance covered, $u_i$ is the initial velocity and $\Delta t_i$ is the time difference ($\Delta t_i = t_i - t_{i-1}$) for $i^{th}$ sensor reading.

Each dimension d (length, width and height) is estimated as per equation (7)

$$d = \Sigma si\qquad(7)$$

wherein, i is the number of sensor reading for a particular dimension.

The calculation of "d" independently for the three dimensions (length, width and height) gives the three dimensional measurement of the physical object as under consideration.

The present invention as per the disclosed embodiment is a novel system enabling the estimation of three dimensional measurements of a physical object without any special set-up required like homogenous background, additional hardware etc. Furthermore, the disclosed invention does not suffer from precision limitations and object identification object drawbacks.

The foregoing description of the present disclosure, along with its associated embodiments, has been presented for purposes of illustration only. It is not exhaustive and does not limit the present disclosure to the precise form disclosed. Those skilled in the art will appreciate from the foregoing description that modifications and variations are possible in light of the above teachings or may be acquired from practicing the disclosed embodiments.

Furthermore, the steps described need not be performed in the same sequence discussed or with the same degree of separation. Various steps may be omitted, repeated, combined, or divided, as necessary to achieve the same or similar objectives or enhancements. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the disclosed invention.

The invention claimed is:

1. A system for estimating three-dimensional measurements of a physical object, the system comprising:
    a handheld unit configured to capture three dimensional aspects of the physical object from different viewpoints, locations and angles by employing a gyroscope, a magnetometer, and an accelerometer, wherein the gyroscope, the magnetometer and the accelerometer are configured to capture raw data recordings;
    one or more processors;
    a memory coupled to the processor, wherein the processor is configured to execute programmed instructions stored in the memory to:

receive the raw data recordings from the gyroscope, the magnetometer, and the accelerometer to process the raw data recordings to develop a raw rotation matrix expressing an orientation of the physical object in Earth co-ordinates through Euler angle method, wherein the raw data recordings comprise an angular velocity of the handheld device captured by the gyroscope, a magnetic intensity indicating absolute geographic direction in a direction to the geographic north captured by the magnetometer, and a linear acceleration and a tilt due to gravity captured by the accelerometer, wherein the raw data recordings are received in the form of physical objects coordinates;

perform, low pass filtering of the rotation matrix to obtain processed Rotation Matrix constituted of filtered Euler angles;

collect individual acceleration recordings from the accelerometer and apply a correction factor to the acceleration recordings to overcome static bias, wherein the static bias is estimated as $$b_{mean} = \frac{1}{N}\sum (a_i),$$

where, $b_{mean}$ is the static bias, a is the individual accelerometer recording, i=1...N and "N" is number of accelerometer recordings when the handheld unit is in static condition;

preprocess the acceleration recordings by filtering through a non-linear signal filter i.e. a median filter signal with a window length W, wherein the accelerometer recordings output after filtering will be $a_{[w/2]}$=Median($a_j$), where, j=1...W, W being an odd number, M=number of accelerometer recordings when the user is scanning the object with the handheld unit for estimating the dimensions and w<M;

estimate, gravitational component along X-axis, Y-axis and Z-axis based on the acceleration recordings along the X-axis, the Y-axis and the Z-axis received from the accelerometer and the coordinates from the processed rotation matrix, wherein the accelerometer is a three axis accelerometer;

determine corrected acceleration values by subtracting the gravitational components from the acceleration recordings across the X-axis, the Y-axis and the Z-axis obtained from the accelerometer;

calculate a distance covered by the accelerometer for each dimension, based on the corrected acceleration values and the rotation data, using Newton's law of motion; and estimate in real time the three dimensional measurements of the physical object by summation of the distance calculated for each dimension covered by the accelerometer.

2. The system of claim 1, wherein the dimensions of the physical object are a length, a width and a height, and shape of the physical object is of regular or irregular or a combination thereof.

3. The system of claim 1, wherein for capturing three dimensional aspects of the physical object, one of the handheld unit and the physical object is moved while the other is kept stationary.

4. The system of claim 1, wherein the rotation matrix is a 3×3 matrix wherein each element represents one coordinate describing rotated position of one of unit vectors relative to reference set of coordinates.

5. The system of claim 1 is further configured to estimate structural information of the physical object.

6. A method for estimating three-dimensional measurements of a physical object, the method comprising:

capturing, by a handheld unit, three dimensional aspects of the physical object from different viewpoints, locations and angles by employing a gyroscope, a magnetometer, and an accelerometer, wherein the gyroscope, the magnetometer and the accelerometer capture raw data recordings;

receiving, by a processor, the raw data recordings from the gyroscope, the magnetometer, and the accelerometer to process the raw data recordings to develop a raw rotation matrix expressing an orientation of the physical object in Earth co-ordinates through Euler angle method, wherein the raw data recordings comprise an angular velocity of the handheld device captured by the gyroscope, a magnetic intensity indicating absolute geographic direction in a direction to the geographic north captured by the magnetometer, and a linear acceleration and a tilt due to gravity captured by the accelerometer, wherein the raw data recordings are received in the form of physical objects coordinates;

performing, by the processor, low pass filtering of the rotation matrix to obtain processed Rotation Matrix constituted of filtered Euler angles;

collecting individual acceleration recordings from the accelerometer and applying a correction factor to the acceleration recordings to overcome static bias, wherein the static bias is estimated as $$b_{mean} = \frac{1}{N}\sum (a_i),$$

where, $b_{mean}$ is the static bias, a is the individual accelerometer recording, i=1...N and "N" is number of accelerometer recordings when the handheld unit is in static condition;

preprocessing the acceleration recordings by filtering through a non-linear signal filter i.e. a median filter signal with a window length W, wherein the accelerometer recordings output after filtering will be $a_{[w/2]}$=Median($a_j$), where, j=1...W, W being an odd number, M=number of accelerometer recordings when the user is scanning the object with the handheld unit for estimating the dimensions and w<M;

estimating, by the processor, gravitational component along X-axis, Y-axis and Z-axis based on the acceleration recordings in the X-axis, the Y-axis and the Z-axis received from the accelerometer and the coordinates from the processed rotation matrix, wherein the accelerometer is a three axis accelerometer;

determining, by the processor, corrected acceleration values by subtracting the gravitational components from the acceleration recordings across the X-axis, the Y-axis and the Z-axis obtained from the accelerometer;

calculating, by the processor, a distance covered by the accelerometer for each dimension based on the corrected acceleration values and the rotation data, using Newton's law of motion;

estimating, by the processor, in real time the three dimensional measurements of the physical object by summation of the distance calculated for each dimension covered by the accelerometer.

7. The method of claim 6, wherein the dimensions of the physical object are a length, a width and a height, and shape of the physical object is of regular or irregular or a combination thereof.

8. The method of claim 6 is further configured to estimate structural information of the physical object.

9. The method of claim 6, wherein for capturing three dimensional aspects of the physical object, one of the handheld unit and the physical object is moved while the other is kept stationary.

10. The method of claim 6, wherein the rotation matrix is a 3×3 matrix wherein each element represents one coordinate describing rotated position of one of unit vectors relative to reference set of coordinates.

* * * * *